United States Patent
Tezuka et al.

(10) Patent No.: US 12,265,686 B2
(45) Date of Patent: Apr. 1, 2025

(54) ELECTROCONDUCTIVE FILM AND DISPLAY DEVICE

(71) Applicant: TDK Corporation, Tokyo (JP)

(72) Inventors: Kenichi Tezuka, Tokyo (JP); Mei Fukaya, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 18/697,117

(22) PCT Filed: Oct. 6, 2022

(86) PCT No.: PCT/JP2022/037459
§ 371 (c)(1),
(2) Date: Mar. 29, 2024

(87) PCT Pub. No.: WO2023/058718
PCT Pub. Date: Apr. 13, 2023

(65) Prior Publication Data
US 2025/0036244 A1    Jan. 30, 2025

(30) Foreign Application Priority Data

Oct. 8, 2021  (JP) .................. 2021-166098

(51) Int. Cl.
*G06F 3/044* (2006.01)
(52) U.S. Cl.
CPC .. *G06F 3/0446* (2019.05); *G06F 2203/04112* (2013.01)
(58) Field of Classification Search
None
See application file for complete search history.

(56) References Cited

U.S. PATENT DOCUMENTS

| | | |
|---|---|---|
| 2011/0237309 A1 | 9/2011 | Shoji et al. |
| 2015/0293559 A1 | 10/2015 | Park et al. |
| 2017/0147107 A1 | 5/2017 | Ishizaki et al. |
| 2017/0308192 A1* | 10/2017 | Ogura ................ G06F 3/04164 |
| 2019/0146613 A1 | 5/2019 | Ishizaki et al. |
| 2019/0324578 A1 | 10/2019 | Ishizaki et al. |

FOREIGN PATENT DOCUMENTS

| | | |
|---|---|---|
| JP | 2008-270634 A | 11/2008 |
| JP | 2011-205635 A | 10/2011 |
| JP | 2015-204094 A | 11/2015 |
| JP | 2017-097671 A | 6/2017 |

* cited by examiner

*Primary Examiner* — Nicholas J Lee
(74) *Attorney, Agent, or Firm* — Oliff PLC

(57) ABSTRACT

An electroconductive pattern includes a third mesh portion that does not include the end electroconductive line as one side constituting the mesh portion, and in a case where a triangular virtual mesh portion including a portion extended from one electroconductive line of the first electroconductive line and of the second electroconductive line which constitute the third mesh portion to the end electroconductive line, a virtual line assuming that another electroconductive line is extended to the end electroconductive line, and the end electroconductive line is set, a length of a common electroconductive line between the first mesh portion and the third mesh portion is longer than the virtual line of the virtual mesh portion, and each of an opening area of the first mesh portion and an opening area of the second mesh portion is larger than an opening area of the virtual mesh portion.

11 Claims, 11 Drawing Sheets

Fig.9

| CORRESPONDENCE DIAGRAM | | AVERAGE AREA RATIO | S21(dB)@28GHz |
|---|---|---|---|
| FIG. 8 | COMPARATIVE EXAMPLE | 0.45 | -3.88 |
| FIG. 5 | EXAMPLE | 0.447 | -3.85 |

ELECTROCONDUCTIVE FILM AND DISPLAY DEVICE

TECHNICAL FIELD

The present disclosure relates to an electroconductive film and a display device.

BACKGROUND ART

Conventionally, an antenna device is known which includes a flexible transparent plate and an antenna element having a mesh portion formed on a main surface of the transparent plate (for example, Patent Literature 1). In the antenna device, the mesh portion of the antenna element has electroconductive lines that intersect each other while being inclined with respect to the extending direction of the antenna element.

The mesh portion of the antenna element has the plurality of mesh portions formed by arranging the intersecting electroconductive lines at a constant pitch.

CITATION LIST

Patent Literature

Patent Literature 1: Japanese Unexamined Patent Publication No. 2011-205635

SUMMARY OF INVENTION

Technical Problem

Here, in the antenna device as described above, a mesh portion having an opening area smaller than that of a basic mesh portion is sometimes formed at an end part of the mesh portion of the antenna element. In that case, if the opening area of the mesh portion at the end part is too small, the electroconductive lines constituting that mesh portion are densely packed. In this case, there is a possibility that the electroconductive lines collapse or the like to be connected to each other during manufacturing or the like. The occurrence of such collapse forms a thick electroconductive line, which increases the visibility. In a case where the antenna device is incorporated in a display device, it is required to reduce the visibility of the electroconductive lines to a minimum. On the other hand, if the opening area of the mesh portion at the end part is too large, the transmission characteristics of the mesh portion of the antenna element may be extremely degraded.

To address this, an object of the present disclosure is to provide an electroconductive film capable of reducing the visibility of an electroconductive line at an end part of an electroconductive pattern while preventing extreme degradation of transmission characteristics, and a display device.

Solution to Problem

An electroconductive film according to one aspect of the present disclosure is an electroconductive film including: a film-like substrate; and a mesh-like electroconductive pattern disposed on a main surface of the substrate, in which the electroconductive pattern includes a plurality of first electroconductive lines and a plurality of second electroconductive lines configured to extend along the main surface and intersect each other, and to be inclined with respect to an end electroconductive line constituting an end part of the electroconductive pattern, the electroconductive pattern includes at least a first mesh portion including the end electroconductive line; a second mesh portion adjacent to the first mesh portion; and a third mesh portion configured to have a polygonal shape different from that of each of the first mesh portion and the second mesh portion and not to include the end electroconductive line as one side constituting the mesh portion, and in a case where a triangular virtual mesh portion including a portion extended from one electroconductive line of the first electroconductive line and of the second electroconductive line which constitute the third mesh portion to the end electroconductive line, a virtual line assuming that another electroconductive line is extended to the end electroconductive line, and the end electroconductive line is set, a length of a common electroconductive line between the first mesh portion and the third mesh portion is longer than the virtual line of the virtual mesh portion, and each of an opening area of the first mesh portion and an opening area of the second mesh portion is larger than an opening area of the virtual mesh portion.

A display device according to one aspect of the present disclosure includes the above-described electroconductive film.

Advantageous Effects of Invention

According to one aspect of the present disclosure, it is possible to provide an electroconductive film capable of reducing the visibility of an electroconductive line at an end part of an electroconductive pattern while preventing extreme degradation of transmission characteristics, and a display device.

BRIEF DESCRIPTION OF DRAWINGS

FIG. 9 is a table indicating conditions and measured values of an example and a comparative example.

DESCRIPTION OF EMBODIMENTS

Hereinafter, some embodiments of the present disclosure will be described in detail. However, the present disclosure is not limited to the following embodiments.

Figure 1:
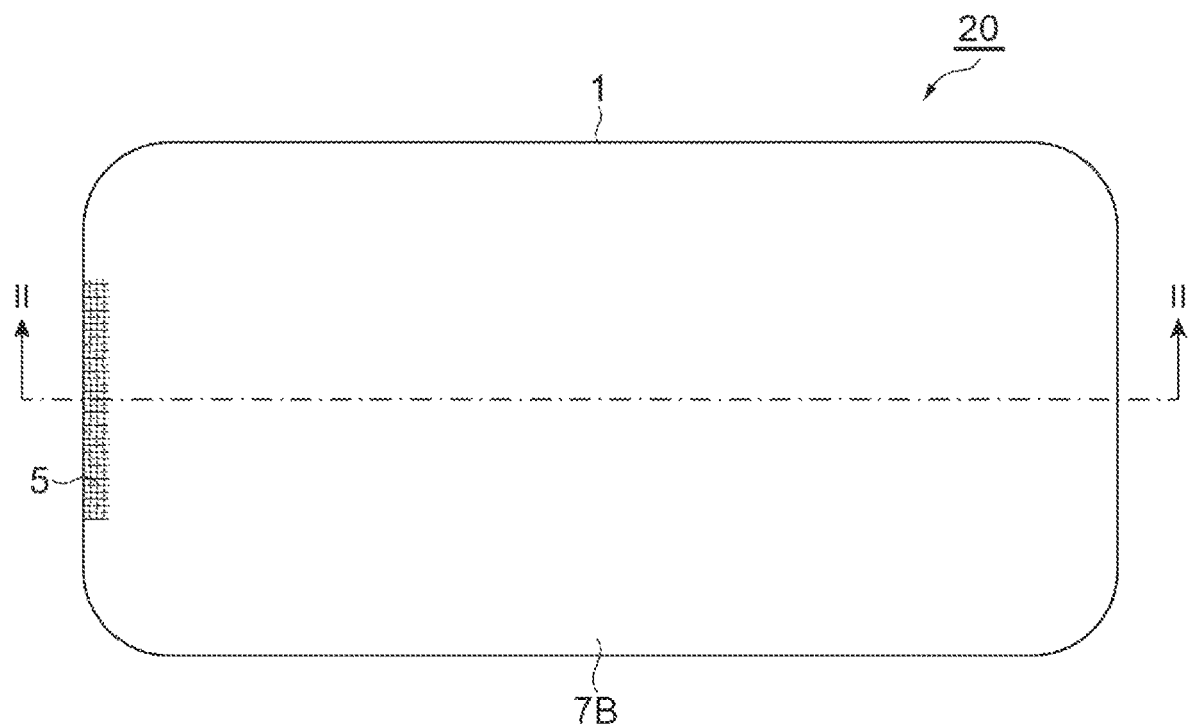
FIG. 1 is a plan view illustrating an embodiment of an electroconductive film.
Figure 2:
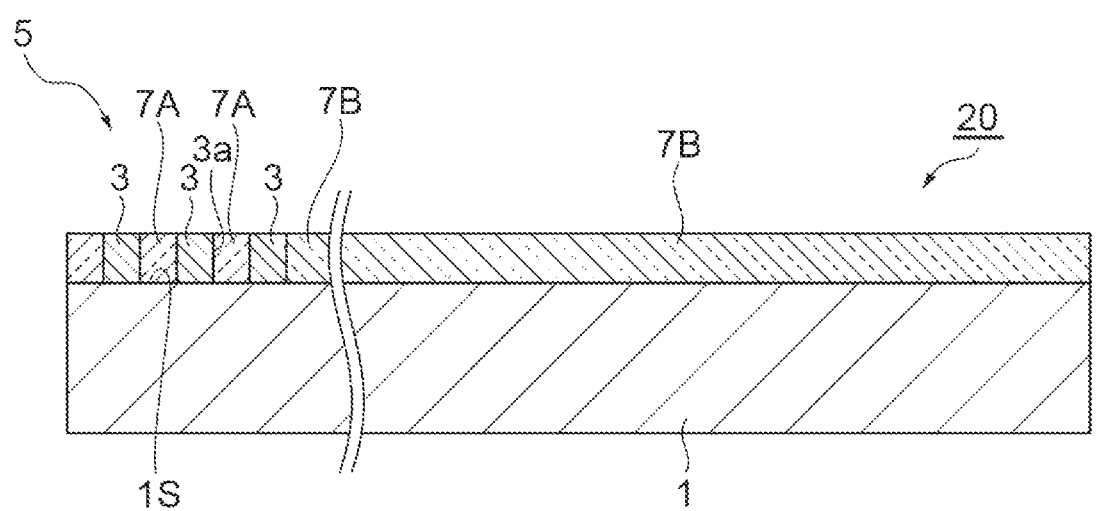
FIG. 2 is a cross-sectional view taken along the line II-II of FIG. 1.

FIG. 1 is a plan view illustrating an embodiment of an electroconductive film, and FIG. 2 is a cross-sectional view taken along the line II-II of FIG. 1. An electroconductive film 20 illustrated in FIGS. 1 and 2 includes a film-like light transmissive substrate 1 (substrate), an electroconductive layer 5 provided on one main surface 1S of the light transmissive substrate 1, and a light transmissive resin layer 7B provided on that one main surface 1S of the light transmissive substrate 1. The electroconductive layer 5 includes a conductor portion 3 that includes a part having a pattern extending in a direction along the main surface 1S of the light transmissive substrate 1 and including a plurality of openings 3a, and an insulating resin portion 7A filling the openings 3a of the conductor portion 3. In FIG. 2, the electroconductive layer 5 is illustrated in a deformed manner, and the width of the conductor portion 3 is illustrated in an emphasized manner. In the example illustrated in FIG. 1, the electroconductive layer 5 is formed near one short side of the electroconductive film 20, but the position where the electroconductive layer 5 is formed is not particularly limited, and the electroconductive layer 5 may be formed near a long side.

The light transmissive substrate 1 has light transmissivity to an extent required when the electroconductive film 20 is incorporated in a display device. Specifically, the total light transmittance of the light transmissive substrate 1 may be 90 to 100%. The light transmissive substrate 1 may have a haze of 0 to 5%.

The light transmissive substrate 1 may be, for example, a transparent resin film, and examples thereof include a film of polyethylene terephthalate (PET), polycarbonate (PC), polyethylene naphthalate (PEN), cycloolefin polymer (COP), or polyimide (PI). Alternatively, the light transmissive substrate 1 may be a glass substrate.

Figure 11:
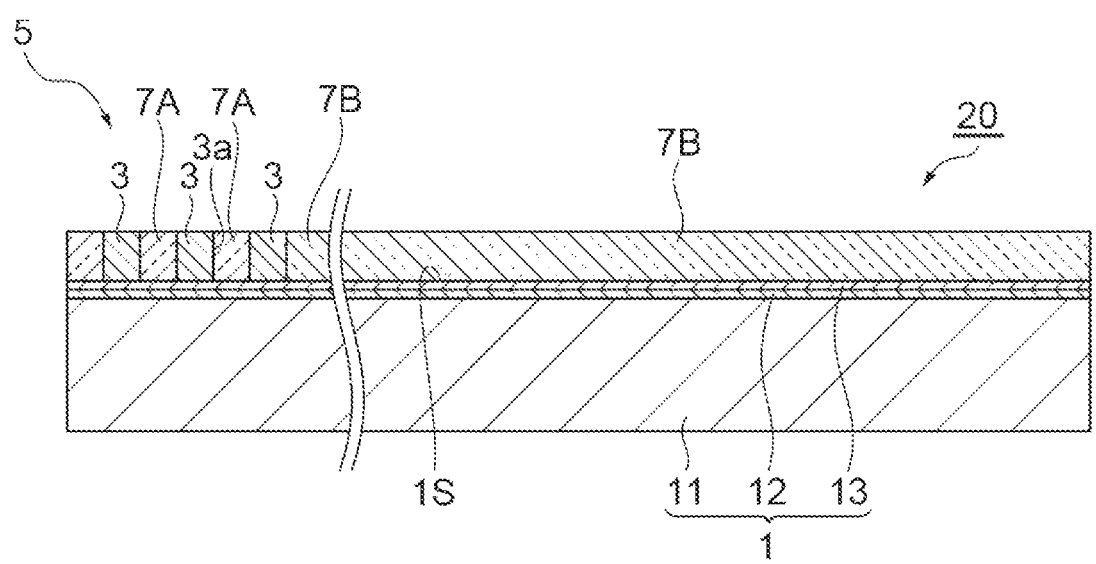
FIG. 11 is a cross-sectional view of an electroconductive film according to a modification.

For example, as illustrated in FIG. 11, the light transmissive substrate 1 may be a laminate including a light transmissive support film 11, and an intermediate resin layer 12 and an underlying layer 13 sequentially provided on the support film 11. The support film 11 can be the transparent resin film. The underlying layer 13 is a layer provided in order to form the conductor portion 3 by electroless plating or the like. In a case where the conductor portion 3 is formed by another method, the underlying layer 13 is not necessarily provided. It is not essential that the intermediate resin layer 12 is provided between the support film 11 and the underlying layer 13.

The thickness of the light transmissive substrate 1 or the support film 11 constituting the same may be 10 μm or more, 20 μm or more, or 35 μm or more, and may be 500 μm or less, 200 μm or less, or 100 μm or less.

Providing the intermediate resin layer 12 can improve adhesion between the support film 11 and the underlying layer 13. In a case where the underlying layer 13 is not provided, the intermediate resin layer 12 is provided between the support film 11 and the light transmissive resin layer 7B, so that adhesion between the support film 11 and the light transmissive resin layer 7B can be improved.

The intermediate resin layer 12 may be a layer containing a resin and an inorganic filler. Examples of the resin constituting the intermediate resin layer 12 include an acrylic resin. Examples of the inorganic filler include silica.

The thickness of the intermediate resin layer 12 may be, for example, 5 nm or more, 100 nm or more, or 200 nm or more, and may be 10 μm or less, 5 μm or less, or 2 μm or less.

The underlying layer 13 may be a layer containing a catalyst and a resin. The resin may be a cured product of a curable resin composition. Examples of a curable resin contained in the curable resin composition include an amino resin, a cyanate resin, an isocyanate resin, a polyimide resin, an epoxy resin, an oxetane resin, a polyester, an allyl resin, a phenolic resin, a benzoxazine resin, a xylene resin, a ketone resin, a furan resin, a COPNA resin, a silicon resin, a dicyclopentadiene resin, a benzocyclobutene resin, an episulfide resin, a thiol-ene resin, a polyazomethine resin, a polyvinyl benzyl ether compound, acenaphthylene, and an ultraviolet curable resin containing a functional group that causes a polymerization reaction with ultraviolet rays such as an unsaturated double bond, a cyclic ether, and a vinyl ether.

The catalyst contained in the underlying layer 13 may be an electroless plating catalyst. The electroless plating catalyst may be a metal selected from Pd, Cu, Ni, Co, Au, Ag, Pd, Rh, Pt, In, and Sn, or may be Pd. The catalyst may be one kind alone or a combination of two or more kinds. Usually, the catalyst is dispersed in the resin as catalyst particles.

The content of the catalyst in the underlying layer 13 may be 3 mass % or more, 4 mass % or more, or 5 mass % or more, and may be 50 mass % or less, 40 mass % or less, or 25 mass % or less with respect to the total amount of the underlying layer 13.

The thickness of the underlying layer 13 may be 10 nm or more, 20 nm or more, or 30 nm or more, and may be 500 nm or less, 300 nm or less, or 150 nm or less.

The light transmissive substrate 1 may further include a protective layer provided on a main surface of the support film 11 opposite to the light transmissive resin layer 7B and the conductor portion 3. Providing the protective layer prevents the support film 11 from being scratched. The protective layer can be a layer similar to the intermediate resin layer 12. The thickness of the protective layer may be 5 nm or more, 50 nm or more, or 500 nm or more, and may be 10 μm or less, 5 μm or less, or 2 μm or less.

The conductor portion 3 constituting the electroconductive layer 5 includes a part having a pattern including the openings 3a. The pattern including the openings 3a is a mesh-like pattern that is formed by a plurality of linear portions intersecting each other and includes the plurality of openings 3a regularly arranged. The conductor portion 3 having the mesh-like pattern can favorably function as, for example, a radiating element, a power supply portion, and a ground portion of an antenna. The configuration of the pattern of the electroconductive layer 5 in the electroconductive layer 5 will be detailed later. In addition to the part having the pattern including the openings 3a, the conductor portion 3 may have a part corresponding to an electroconductive member such as a ground terminal and a power supply terminal.

The conductor portion 3 may contain metal. The conductor portion 3 may contain at least one metal selected from copper, nickel, cobalt, palladium, silver, gold, platinum, and tin, or may contain copper. The conductor portion 3 may be metal plating formed by a plating method. The conductor portion 3 may further contain a nonmetallic element such as phosphorus within a range in which appropriate conductivity is maintained.

The conductor portion 3 may be a laminate including a plurality of layers. In addition, the conductor portion 3 may have a blackened layer as a surface layer portion on a side opposite to the light transmissive substrate 1. The blackened layer can contribute to improvement in visibility of a display device in which the electroconductive film is incorporated.

The insulating resin portion 7A is formed of a light transmissive resin and is provided so as to fill the openings 3a of the conductor portion 3, and the insulating resin portion 7A and the conductor portion 3 usually form a flat surface.

The light transmissive resin layer 7B is formed of a light transmissive resin. The total light transmittance of the light transmissive resin layer 7B may be 90 to 100%. The light transmissive resin layer 7B may have a haze of 0 to 5%.

The difference between the light transmissive substrate 1 (or the refractive index of the support film constituting the light transmissive substrate 1) and the refractive index of the light transmissive resin layer 7B may be 0.1 or less. As a result, good visibility of a display image is more easily achieved. The refractive index (nd 25) of the light transmissive resin layer 7B may be, for example, 1.0 or more, and may be 1.7 or less, 1.6 or less, or 1.5 or less. The refractive index can be measured by a spectroscopic ellipsometer. In terms of uniformity of the optical path length, the conductor portion 3, the insulating resin portion 7A, and the light transmissive resin layer 7B may have substantially the same thickness.

The resin forming the insulating resin portion 7A and the light transmissive resin layer 7B may be a cured product of a curable resin composition (photocurable resin composition or thermosetting resin composition). The curable resin composition forming the insulating resin portion 7A and/or the light transmissive resin layer 7B includes a curable resin, and examples thereof include an acrylic resin, an amino resin, a cyanate resin, an isocyanate resin, a polyimide resin, an epoxy resin, an oxetane resin, a polyester, an allyl resin, a phenolic resin, a benzoxazine resin, a xylene resin, a ketone resin, a furan resin, a COPNA resin, a silicon resin, a dicyclopentadiene resin, a benzocyclobutene resin, an episulfide resin, a thiol-ene resin, a polyazomethine resin, a polyvinyl benzyl ether compound, acenaphthylene, and an ultraviolet curable resin containing a functional group that causes a polymerization reaction with ultraviolet rays such as an unsaturated double bond, a cyclic ether, and a vinyl ether.

The resin forming the insulating resin portion 7A and the resin forming the light transmissive resin layer 7B may be the same. Since the insulating resin portion 7A and the light transmissive resin layer 7B formed of the same resin have the same refractive index, the uniformity of the optical path length transmitted through the electroconductive film 20 can be further improved. In a case where the resin forming the insulating resin portion 7A and the resin forming the light transmissive resin layer 7B are the same, for example, the insulating resin portion 7A and the light transmissive resin layer 7B can be easily and collectively formed by forming a pattern from one curable resin layer by an imprinting method or the like.

The electroconductive film 20 can be manufactured, for example, by a method including pattern formation by the imprinting method. An example of a method for manufacturing the electroconductive film 20 includes: preparing the light transmissive substrate 1 including the support film, the intermediate resin layer, and the underlying layer containing the catalyst, the intermediate resin layer, and the underlying layer being provided on one main surface of the support film; forming the curable resin layer on the main surface 1S on the underlying layer side of the light transmissive substrate 1; forming a trench in which the underlying layer is exposed by an imprinting method using a mold having a convex portion; and forming the conductor portion 3 filling the trench by an electroless plating method in which metal plating is grown from the underlying layer. The curable resin layer is cured in a state where the mold is pushed into the curable resin layer to thereby form collectively the insulating resin portion 7A having a pattern including an opening with an inverted shape of the convex portion of the mold, and the light transmissive resin layer 7B. The method for forming the insulating resin portion 7A having the pattern including the opening is not limited to the imprinting method, and any method such as photolithography can be applied.

Figure 3:
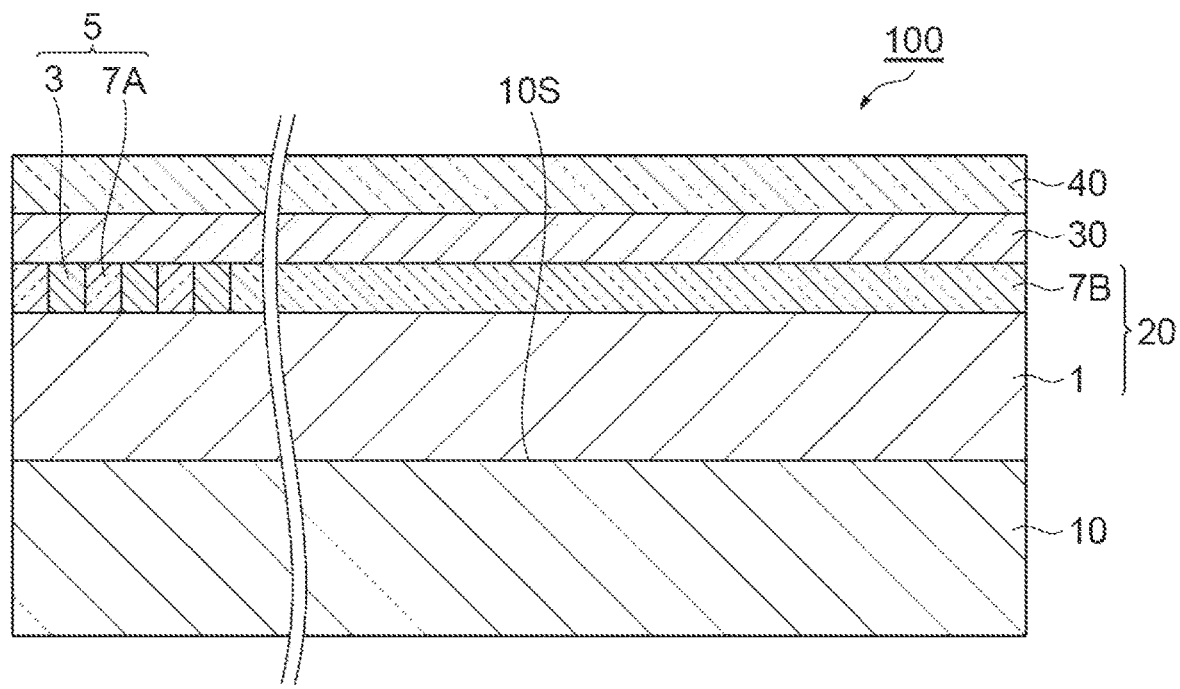
FIG. 3 is a cross-sectional view illustrating an embodiment of a display device.

The electroconductive film described above as an example can be incorporated into a display device as, for example, a planar transparent antenna. The display device may be, for example, a liquid crystal display device or an organic EL display device. FIG. 3 is a cross-sectional view illustrating an embodiment of a display device in which an electroconductive film is incorporated. A display device 100 illustrated in FIG. 3 includes an image display unit 10 having an image display region 10S, the electroconductive film 20, a polarizing plate 30, and a cover glass 40. The electroconductive film 20, the polarizing plate 30, and the cover glass 40 are laminated, in this order from the image display unit 10 side, on the image display region 10S side of the image display unit 10. The configuration of the display device is not limited to the form of FIG. 3, and can be appropriately changed as necessary. For example, the polarizing plate 30 may be provided between the image display unit 10 and the electroconductive film 20. The image display unit 10 may be, for example, a liquid crystal display unit. As the polarizing plate 30 and the cover glass 40, those commonly used in a display device can be used. The polarizing plate 30 and the cover glass 40 are not necessarily provided. Light for image display emitted from the image display region 10S of the image display unit 10 passes through a path having a highly uniform optical path length including the electroconductive film 20. This makes it possible to display an image with high uniformity and favorable quality with suppressed moire.

Figure 4:
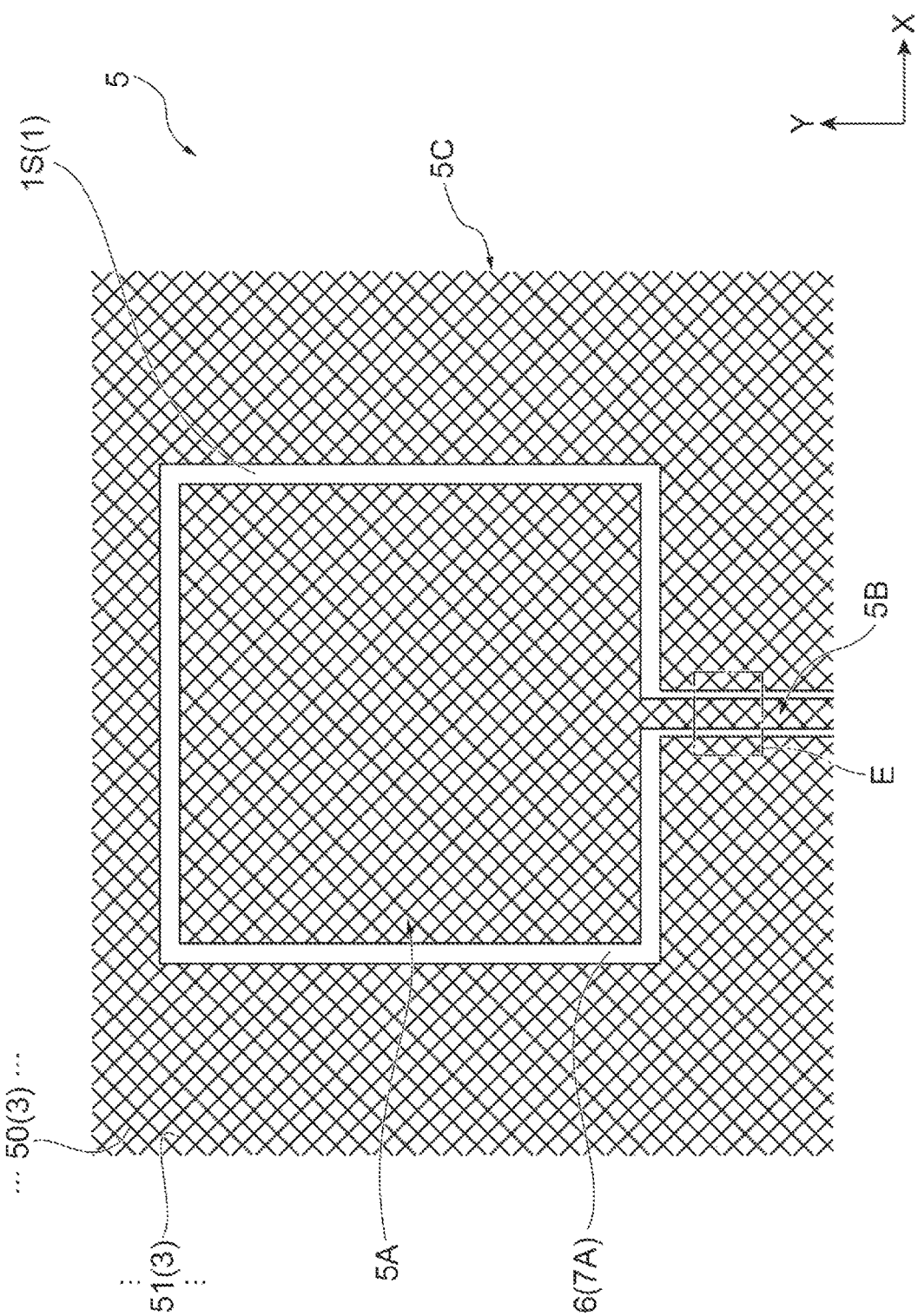
FIG. 4 is a plan view of an electroconductive layer.

Next, the configuration of the electroconductive layer 5 will be described in more detail with reference to FIG. 4. FIG. 4 is a plan view of the electroconductive layer 5. FIG. 4 is an enlarged view of a part of the electroconductive layer 5. In the following description, it is assumed that XY coordinates are set with respect to a plane parallel to the main surface 1S. The Y-axis direction (extending direction) is a direction along the main surface 1S, and corresponds to a direction orthogonal to a side portion of the electroconductive film 20 in the example illustrated in FIG. 1. The center side of the electroconductive film 20 is defined as a positive side in the Y-axis direction, and the outer peripheral side of the electroconductive film 20 is defined as a negative side in the Y-axis direction. The X-axis direction is a direction orthogonal to the Y-axis direction along the main surface 1S, and corresponds to a direction in which the side portion of the electroconductive film 20 extends in the example illustrated in FIG. 1. One side in which the side portion of the electroconductive film 20 extends is defined as a positive side in the X-axis direction, and the other side is defined as a negative side in the X-axis direction.

As illustrated in FIG. 4, the mesh pattern of the electroconductive layer 5 includes a plurality of first electroconductive lines 50 and a plurality of second electroconductive lines 51. The first electroconductive line 50 is the linear conductor portion 3 extending so as to be inclined with respect to the Y-axis direction (with respect to an end electroconductive line 52 constituting an end part). The first electroconductive line 50 extends toward the positive side in the Y-axis direction from the negative side toward the positive side in the X-axis direction. The plurality of first electroconductive lines 50 is arranged to be spaced apart from each other and parallel to each other. The plurality of first electroconductive lines 50 is arranged to be spaced apart at a constant pitch. The second electroconductive line 51 is the linear conductor portion 3 extending so as to be inclined with respect to the Y-axis direction. The second electroconductive line 51 extends toward the negative side in the Y-axis direction from the negative side toward the positive side in the X-axis direction. The plurality of second electroconductive lines 51 is arranged to be spaced apart from each other and parallel to each other. The plurality of second electroconductive lines 51 is arranged to be spaced apart at a constant pitch. In this manner, the first electroconductive lines 50 and the second electroconductive lines 51 intersect each other. In the present embodiment, the first electroconductive lines 50 and the second electroconductive lines 51 are inclined at 45° with respect to the Y-axis direction. The thickness of the electroconductive lines 50 and 51 is not particularly limited, and may be set to 1 μm or more and less than 2 μm. The pitch of the electroconductive lines 50 and 51 is not particularly limited, and may be set to, for example, 100 to 300 μm.

The electroconductive layer 5 includes a radiating element portion 5A, a power supply portion 5B, and a ground portion 5C. The radiating element portion 5A is a region that radiates a signal as an antenna. The radiating element portion 5A has a square shape having two sides parallel to the Y-axis direction and two sides parallel to the X-axis direction. The power supply portion 5B is a region that feeds power to the radiating element portion 5A. The power supply portion 5B has a belt-like shape extending parallel to the Y-axis direction. The power supply portion 5B is connected to the side of the radiating element portion 5A on the negative side in the Y-axis direction. The power supply portion 5B is connected to a power supply terminal portion (not illustrated). The ground portion 5C is an electrically grounded region. The ground portion 5C is connected to a ground terminal (not illustrated). The ground portion 5C is formed so as to surround the radiating element portion 5A and the power supply portion 5B. A slit portion 6 in which no mesh is formed is provided between the ground portion 5C and each side of the radiating element portion 5A and between the ground portion 5C and each side of the power supply portion 5B. The insulating resin portion 7A is formed in the slit portion 6. This allows the ground portion 5C to be electrically insulated from the radiating element portion 5A and the power supply portion 5B.

Figure 5:
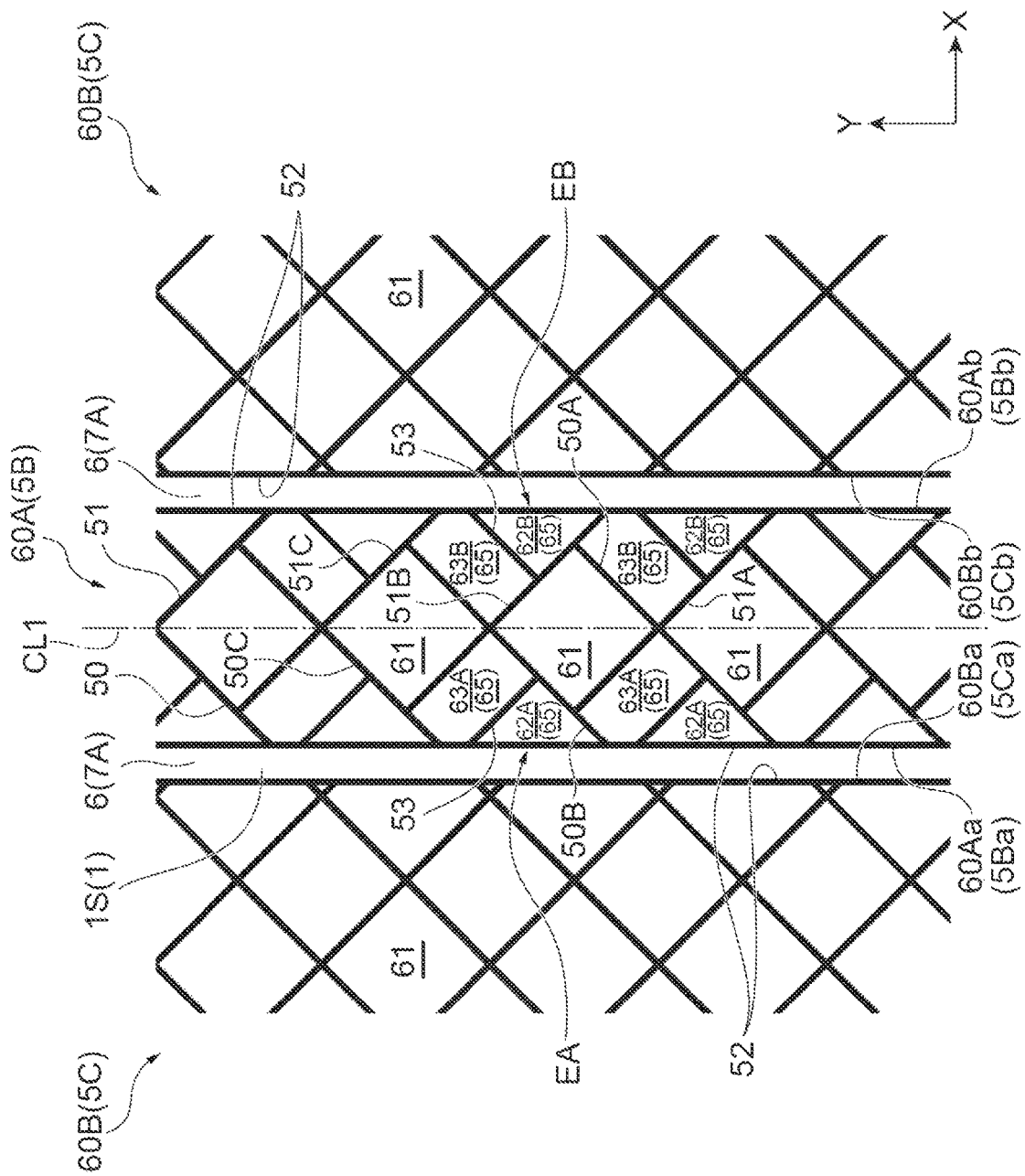
FIG. 5 is an enlarged view of a part indicated by "E" in FIG. 4.

Next, the pattern of the electroconductive layer 5 will be described in more detail with reference to FIG. 5. FIG. 5 is an enlarged view of a part indicated by "E" in FIG. 4. FIG. 5 is an enlarged view of a configuration of the power supply portion 5B in the vicinity of an end part 5Ba on the negative side and an end part 5Bb on the positive side in the X-axis direction. Note that the ground portion 5C has an end part 5Ca facing the end part 5Ba of the power supply portion 5B and an end part 5Cb facing the end part 5Bb of the power supply portion 5B via the slit portion 6. In FIG. 5, the vicinity of the end parts 5Ca and 5Cb of the ground portion 5C is also enlarged. As illustrated in FIG. 5, the end parts 5Ba, 5Bb, 5Ca, and 5Cb are constituted by the end electroconductive lines 52 extending in parallel to the Y-axis direction.

The electroconductive film 20 has a mesh-like electroconductive pattern 60A and electroconductive pattern 60B arranged on the main surface 1S of the light transmissive substrate 1. The electroconductive pattern 60A and the electroconductive pattern 60B include the first electroconductive lines 50 and the second electroconductive lines 51. The electroconductive pattern 60A is formed in the power supply portion 5B. The electroconductive pattern 60B is formed near the end parts 5Ca and 5Cb of the ground portion 5C. An end part 60Aa of the electroconductive pattern 60A on the negative side in the X-axis direction corresponds to the end part 5Ba of the power supply portion 5B, and an end part 60Ab of the electroconductive pattern 60A on the positive side in the X-axis direction corresponds to the end part 5Bb of the power supply portion 5B. End parts 60Ba and 60Bb of the electroconductive pattern 60B facing the electroconductive pattern 60A correspond to the end parts 5Ca and 5Cb of the ground portion 5C. Therefore, the end parts 60Aa, 60Ab, 60Ba, and 60Bb of the electroconductive patterns 60A and 60B are configured by the end electroconductive lines 52.

In order to describe the configuration of the electroconductive pattern 60A, the first electroconductive lines 50 of the electroconductive pattern 60A may be identified as "first electroconductive lines 50A to 50C". The first electroconductive line 50 at an arbitrary position of the electroconductive pattern 60A is referred to as the "first electroconductive line 50A", and the first electroconductive lines 50 toward the positive side in the Y-axis direction are sequentially referred to as the "first electroconductive line 50B" and the "first electroconductive line 50C". Further, the second electroconductive lines 51 of the electroconductive pattern 60A may be identified as "second electroconductive lines 51A to 51C". The second electroconductive line 51 at an arbitrary position of the electroconductive pattern 60A is referred to as the "second electroconductive line 51A", and the second electroconductive lines 51 toward the positive side in the Y-axis direction are sequentially referred to as the "second electroconductive line 51B" and the "second electroconductive line 51C". A reference line in the electroconductive pattern 60A is referred to as a "reference line CL1". At this time, the reference line CL1 is the center line set for a basic mesh portion 61 continuous in the Y-axis direction. An intersection of the electroconductive lines 50A and 51A, an intersection of the electroconductive lines 50B and 51B, and an intersection of the electroconductive lines 50C and 51C are placed on the reference line CL1.

The electroconductive pattern 60A includes the basic mesh portion 61 (third mesh portion) and an end mesh portion 65. The end mesh portion 65 is a mesh portion that is provided on the end parts 60Aa and 60Ab side of the electroconductive pattern 60A and has a predetermined polygonal shape. In the present embodiment, the end mesh portion 65 is a mesh portion other than the basic mesh portion 61 in the electroconductive pattern 60A. The electroconductive pattern 60A includes, as the end mesh portion 65, mesh portions 62A and 62B (first mesh portion) and mesh portions 63A and 63B (second mesh portion).

The basic mesh portion 61 does not include the end electroconductive line 52 as one side constituting the mesh portion, and has a square shape that is different from shapes of the mesh portions 62A, 63A, 62B, and 63B. The basic mesh portion 61 includes a pair of the first electroconductive lines 50A and 50B and a pair of the second electroconductive lines 51A and 51B. The basic mesh portion 61 has a shape that is symmetrical with respect to the reference line CL1. In addition, the basic mesh portions 61 are continuously arranged along the Y-axis direction, which is the extending direction of the electroconductive pattern 60A and the extending direction of the end electroconductive line 52, on the reference line CL1. Note that the basic mesh portion 61 is the basic shape in the radiating element portion 5A, the power supply portion 5B, and the ground portion 5C. In other words, the basic mesh portions 61 are continuous in the X-axis direction and the Y-axis direction at parts other than the end parts of the radiating element portion 5A, the power supply portion 5B, and the ground portion 5C.

Here, a combination of the mesh portion 62A and the mesh portion 63A adjacent to each other is defined as a polygonal region EA in the electroconductive pattern 60A. A combination of one set of mesh portions 62A and 63A corresponds to one polygonal region EA. The polygonal region EA includes the end electroconductive line 52 constituting the end part 60Aa of the electroconductive pattern 60A, and has a trapezoidal shape. The polygonal region EA includes a pair of the first electroconductive lines 50B and 50C, the second electroconductive line 51B, and the end electroconductive line 52 constituting the end part 60Aa. In the polygonal region EA, the first electroconductive line 50B constitutes a lower edge of the trapezoid and the first electroconductive line 50C constitutes an upper edge of the trapezoid. Such a polygonal region EA is divided into the mesh portion 62A and the mesh portion 63A by a common electroconductive line 53 connecting two sides facing each other. Note that details of the mesh portions 62A and 63A will be described later.

Further, a combination of the mesh portion 62B and the mesh portion 63B adjacent to each other is defined as a polygonal region EB in the electroconductive pattern 60A. A combination of one set of mesh portions 62B and 63B corresponds to one polygonal region EB. The polygonal region EB includes the end electroconductive line 52 constituting the end part 60Ab of the electroconductive pattern 60A, and has a trapezoidal shape. The polygonal region EB includes a pair of the second electroconductive lines 51B and 51C, the first electroconductive line 50B, and the end electroconductive line 52 constituting the end part 60Ab. In the polygonal region EB, the second electroconductive line 51B constitutes a lower edge of the trapezoid and the second electroconductive line 51C constitutes an upper edge of the trapezoid. Such a polygonal region EB is divided into the mesh portion 62B and the mesh portion 63B by a common electroconductive line 53 connecting two sides facing each other.

The end mesh portions 65 are arranged in the end parts 60Aa and 60Ab of the electroconductive pattern 60A so as to be symmetric with each other. Here, the mesh portions 62A and 63A and the mesh portions 62B and 63B are arranged at both the end parts 60Aa and 60Ab of the electroconductive pattern 60A so as to be symmetric with respect to the reference line CL1. In addition, the mesh portions 62A and 63A and the mesh portions 62B and 63B are continuously arranged along the Y-axis direction, which is the extending direction of the electroconductive pattern 60A and the extending direction of the end electroconductive line 52. In other words, the mesh portions 62A and 63A and the mesh portions 62B and 63B are regularly arranged along the Y-axis direction which is the extending direction of the end electroconductive line 52 of the electroconductive pattern 60A. In the present embodiment, the mesh portions 62A and 63A and the mesh portions 62B and 63B are arranged so as to be line-symmetric with each other about the reference line CL1, but may be arranged so as to be rotationally symmetric about an arbitrary reference point on the reference line CL1.

Figure 6:
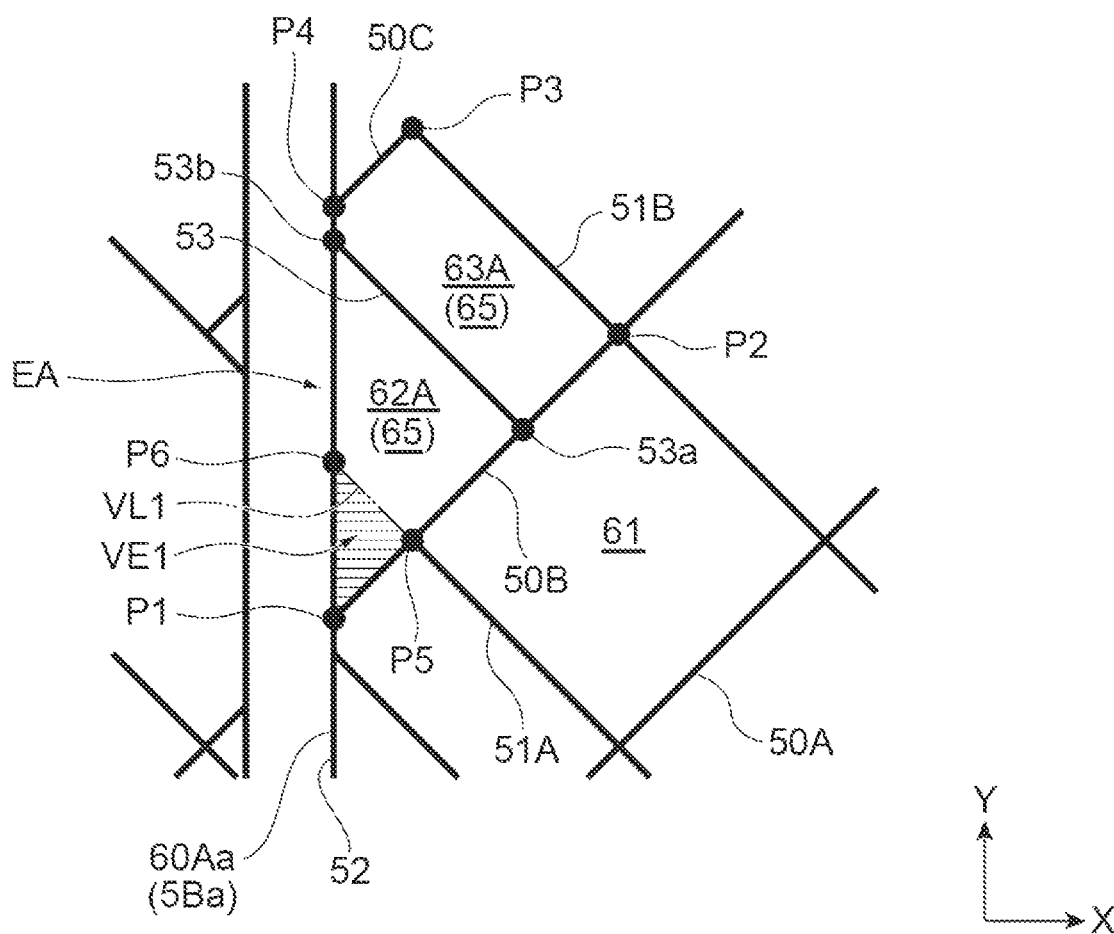
FIG. 6 is an enlarged view of an electroconductive pattern illustrated in FIG. 5.

Next, a detailed configuration of the mesh portion 62A and the mesh portion 63A will be described with reference to FIG. 6. Note that, unless otherwise noted, a configuration of one basic mesh portion 61 in the electroconductive pattern 60A and one polygonal region EA adjacent to the basic mesh portion 61 via the first electroconductive line 50B will be described herein. For the sake of explanation, vertexes P1 to P5 are set. The vertex P1 is a vertex of the polygonal region EA, and is an intersection of the first electroconductive line 50B and the end electroconductive line 52. The vertex P2 is a vertex of the polygonal region EA and the basic mesh portion 61, and is an intersection of the first electroconductive line 50B and the second electroconductive line 51B. The vertex P3 is a vertex of the polygonal region EA and the basic mesh portion 61, and is an intersection of the first electroconductive line 50C and the second electroconductive line 51B. The vertex P4 is a vertex of the polygonal region EA, and is an intersection of the first electroconductive line 50C and the end electroconductive line 52. The vertex P5 is a vertex of the basic mesh portion 61, and is an intersection of the first electroconductive line 50B and the second electroconductive line 51A.

Further, for the sake of explanation, a triangular virtual mesh portion VE1 is set. In FIG. 6, the virtual mesh portion VE1 is hatched. The virtual mesh portion VE1 includes a portion extended from the first electroconductive line 50B (one electroconductive line) constituting the basic mesh portion 61 to the end electroconductive line 52, a virtual line VL1 assuming that the second electroconductive line 51A (the other electroconductive line) is extended to the end electroconductive line 52, and the end electroconductive line 52. An intersection of the virtual line VL1 and the end electroconductive line 52 is defined as a vertex P6 of the virtual mesh portion VE1.

The mesh portion 62A is a mesh portion including the end electroconductive line 52 constituting the end part 60Aa of the electroconductive pattern 60A. The mesh portion 63A is a mesh portion adjacent to the mesh portion 62A via the common electroconductive line 53. In the present embodiment, one end 53a of the common electroconductive line 53 is placed on the first electroconductive line 50B excluding the vertex P5 in the basic mesh portion 61. The one end 53a of the common electroconductive line 53 is placed between the vertex P5 and the vertex P2 on the first electroconductive line 50B. The other end 53b of the common electroconductive line 53 is placed on the end electroconductive line 52. The other end 53b of the common electroconductive line 53 is placed between the vertex P6 and the vertex P4 on the end electroconductive line 52. In this manner, both the one end 53a and the other end 53b of the common electroconductive line 53 are placed outside the virtual mesh portion VE1.

The mesh portion 62A thus includes the first electroconductive line 50B, the common electroconductive line 53, and the end electroconductive line 52. The mesh portion 62A has a triangular shape. The mesh portion 63A includes a pair of the first electroconductive lines 50B and 50C, the second electroconductive line 51B, the end electroconductive line 52, and the common electroconductive line 53. The mesh portion 63A has a pentagonal shape.

The common electroconductive line 53 is arranged at a position closer to the second electroconductive line 51B than the virtual line VL1 of the virtual mesh portion VE1 in the polygonal region EA. As a result, the common electroconductive line 53 is arranged outside the virtual mesh portion VE1. The length of the common electroconductive line 53 is longer than the virtual line VL1 of the virtual mesh portion VE1. The length of the common electroconductive line 53 is equal to or less than the length of the second electroconductive line 51A of the basic mesh portion 61. In the present embodiment, the common electroconductive line 53, the virtual line VL1, and the second electroconductive line 51A (the other electroconductive line) are parallel to each other.

Next, opening areas of the mesh portions 62A and 63A and the basic mesh portion 61 will be described. An area of the region surrounded by a pair of the first electroconductive lines 50 and a pair of the second electroconductive lines 51 corresponds to an "opening area" of a single basic mesh portion 61. Further, an average value of the plurality of basic mesh portions 61 is referred to as an "average opening area". An area of the region surrounded by the first electroconductive line 50B, the common electroconductive line 53, and the end electroconductive line 52 corresponds to an "opening area" of a single mesh portion 62A. An area of the region surrounded by a pair of the first electroconductive lines 50B and 50C, the second electroconductive line 51B, the end electroconductive line 52, and the common electroconductive line 53 corresponds to an "opening area" of a single mesh portion 63A. The same applies to an opening area of each of the mesh portions 62B and 63B. An average opening area of the end mesh portion 65 is an average value of the opening areas of the plurality of mesh portions 62A, 63A, 62B, and 63B.

The average opening area of the end mesh portion 65 may be less than 1.5 times the average opening area of the basic mesh portion 61. The average opening area of the end mesh portion 65 may be equal to or smaller than the average opening area of the basic mesh portion 61. Each of the opening area of the mesh portion 62A and the opening area of the mesh portion 63A is larger than an opening area of the virtual mesh portion VE1. The ratio of the opening areas of the mesh portion 62A and the mesh portion 63A is not particularly limited, but it is preferable that the ratios thereof are as equal as possible. Specifically, in a case where the opening area of the mesh portion 62A is set to "1", the opening area of the mesh portion 63A may be set to a ratio in a range of 0.8 to 1.2.

The mesh portion near the end part 60Ba of the electroconductive pattern 60B may have the same configuration as those of the mesh portions 62B and 63B of the electroconductive pattern 60A. The mesh portion near the end part 60Bb of the electroconductive pattern 60B may have the same configuration as those of the mesh portions 62A and 63A of the electroconductive pattern 60A. Accordingly, also in the electroconductive pattern 60B, it is possible to prevent the visibility from being increased due to collapse of the electroconductive line or the like. In the radiating element portion 5A, both ends in the X-axis direction and both ends in the Y-axis direction of the electroconductive pattern 60A may be configured to have the end mesh portion 65. Further, in the ground portion 5C, end parts in the X-axis direction and the Y-axis direction other than the end parts 5Ca and 5Cb may be configured to have the end mesh portion 65.

Next, functions and effects of the electroconductive film 20 and the display device 100 according to the present embodiment will be described.

According to the electroconductive film 20, the electroconductive pattern 60A includes the plurality of first electroconductive lines 50 and the plurality of second electroconductive lines 51 that extend along the main surface 1S and intersect each other, and are inclined with respect to the extending direction of the end electroconductive lines 52 constituting the end parts of the electroconductive pattern 60A. The electroconductive pattern 60A includes the plurality of basic mesh portions 61 that do not include the end electroconductive line 52 as one side constituting the mesh portion. In addition, the electroconductive pattern 60A includes the mesh portion 62A including the end electroconductive lines 52 constituting the end parts 60Aa and 60Ab of the electroconductive pattern 60A, and the mesh portion 63A adjacent to the mesh portion 62A. The mesh portions 62A and 63A each have a polygonal shape different from that of the basic mesh portion 61. As described above, it is necessary to apply adjustments to the mesh portions 62A and 63A arranged at the end parts 60Aa and 60Ab of the electroconductive pattern 60A in order to prevent the collapse of the electroconductive lines due to an excessively small opening area.

Figure 8:
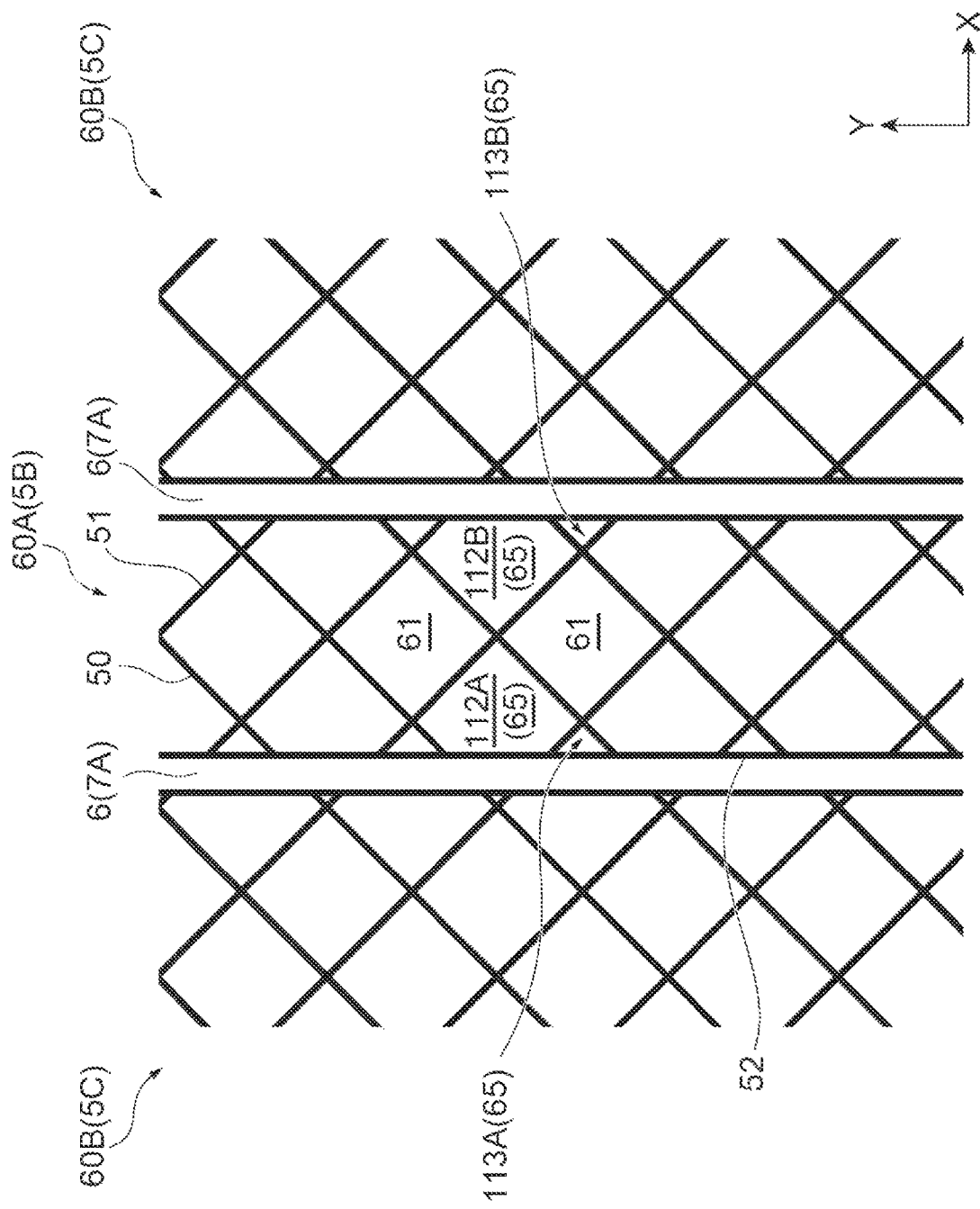
FIG. 8 is an enlarged view of an electroconductive layer of an electroconductive film according to a comparative example.

For example, in a comparative example as illustrated in FIG. 8, a triangular mesh portion 113A is formed at a part extended from the electroconductive lines 50 and 51 of the basic mesh portion 61 to the end electroconductive line 52. Such a mesh portion 113A has a narrow opening area, and there is a possibility that the electroconductive lines 50, 51, and 52 collapse or the like to be connected to each other during manufacturing or the like. The occurrence of such collapse forms a thick electroconductive line, which increases the visibility. The narrow mesh portion 113A is a mesh portion corresponding to the virtual mesh portion VE1 in FIG. 6.

In contrast, in the electroconductive film 20 according to the present embodiment, the length of the common electroconductive line 53 between the mesh portion 62A and the mesh portion 63A is longer than the virtual line VL1 of the virtual mesh portion VE1. That is, the common electroconductive line 53 can be arranged at a position where the virtual line VL1 is shifted so that the opening area of the mesh portion 62A is increased. Further, each of the opening area of the mesh portion 62A and the opening area of the mesh portion 62A is larger than the opening area of the virtual mesh portion VE1. As a result, it is possible to prevent the visibility from being increased due to collapse of the electroconductive line or the like at the end parts 60Aa and 60Ab of the electroconductive pattern 60A. In addition, in a case where the opening area is increased by omitting the electroconductive line, the transmission characteristics are degraded due to the reduction in the electroconductive line. However, in the present embodiment, the opening area is increased by shifting the common electroconductive line 53 from the virtual line VL1. This prevents the reduction in amount of the electroconductive lines and prevents degradation of transmission characteristics. As described above, it is possible to reduce the visibility of the electroconductive lines at the end parts 60Aa and 60Ab of the electroconductive pattern 60A while preventing extreme degradation of transmission characteristics.

The one end 53a of the common electroconductive line 53 may be placed on the first electroconductive line 50 excluding the vertex P5 in the basic mesh portion 61. This allows the common electroconductive line 53 to be shifted to a position where the opening area of the mesh portion 62A is larger than that of the virtual mesh portion VE1.

The common electroconductive line 53 and the second electroconductive line 51A (the other electroconductive line) may be parallel to each other. In this case, the electroconductive pattern 60A can be easily designed.

The other end 53b of the common electroconductive line 53 may be placed on the end electroconductive line 52. In this case, it is possible to prevent the opening area of the mesh portion 63A from becoming too small.

The length of the common electroconductive line 53 may be equal to or less than the length of the second electroconductive line 51 of the basic mesh portion 61. In this case, it is possible to mitigate the imbalance in opening area between the mesh portion 62A and the mesh portion 63A due to the common electroconductive line 53 being too long.

The mesh portions 62A and 62B and the mesh portions 62B and 63B may be arranged in the end parts 60Aa and 60Ab of the electroconductive pattern 60A so as to be symmetric with each other. In this case, the electroconductive pattern 60A can be made into a simple shape.

The end electroconductive line 52 may extend along the extending direction of the electroconductive pattern 60A. In this case, the end electroconductive line 52 extends along the direction in which electricity flows through the electroconductive pattern 60A. That is, it is possible to provide the end mesh portion 65 in which the degradation of transmission characteristics as described above is prevented at the both end parts with respect to the flow of electricity.

The end mesh portion 65 may be regularly arranged along the extending direction of the end electroconductive line 52 of the electroconductive pattern 60A. In this case, the electroconductive pattern 60A can be easily designed in a constant pattern.

The widths of the first electroconductive lines 50 and the second electroconductive lines 51 may be less than 2 μm. In this case, the electroconductive lines 50 and 51 can be made sufficiently thin to lower the visibility.

The display device 100 according to the present embodiment includes the above-described electroconductive film 20.

According to the display device 100, functions and effects similar to those of the above-described electroconductive film 20 can be obtained.

The present disclosure is not limited to the above-described embodiments.

In the above-described embodiment, a part of the virtual mesh portion VE1 corresponding to the second electroconductive line 51 is shifted as the common electroconductive line 53. Alternatively, a part of the virtual mesh portion VE1 corresponding to the first electroconductive line 50 may be shifted as the common electroconductive line 53.

Figure 7:
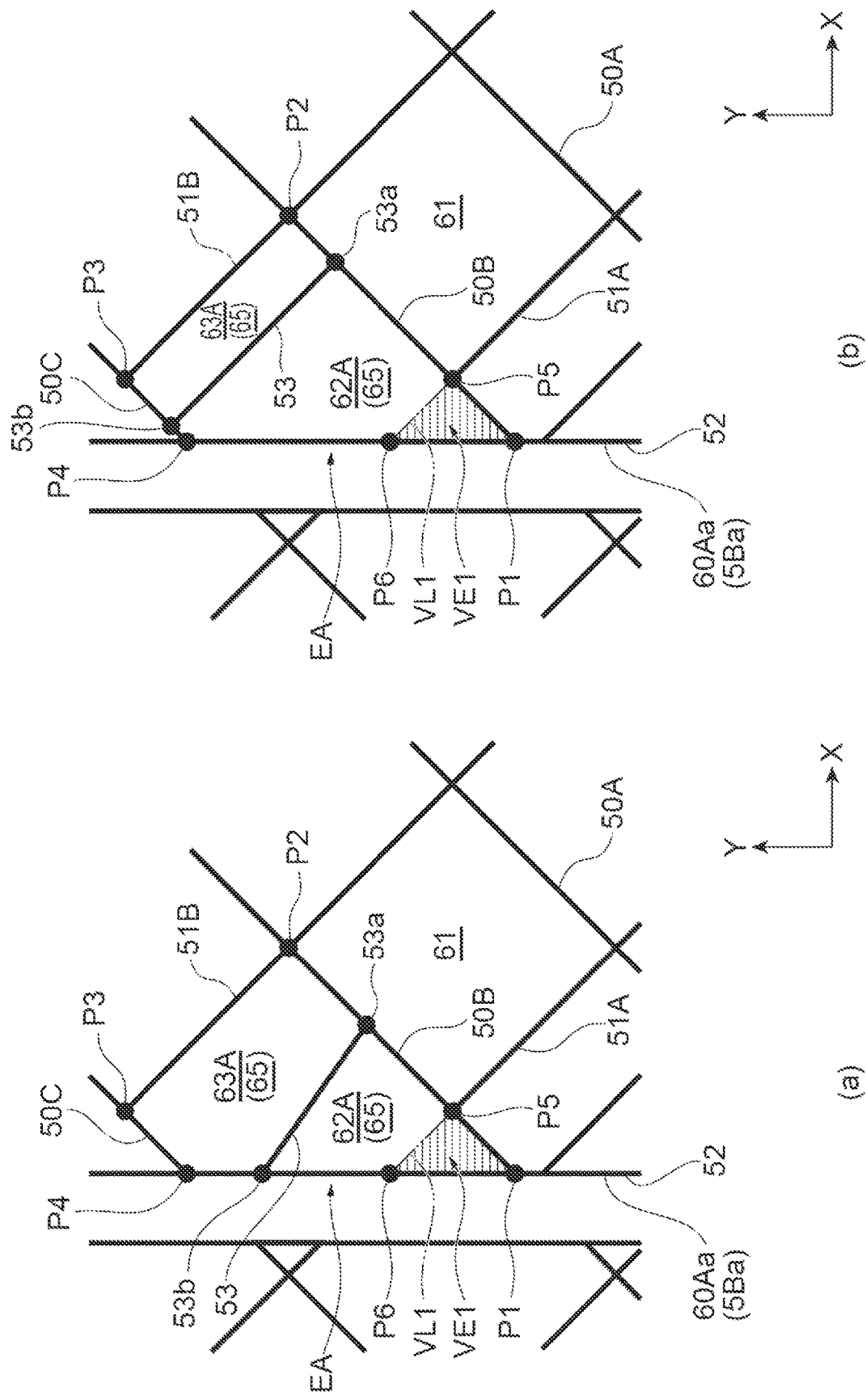
FIG. 7 is an enlarged view of an electroconductive layer of an electroconductive film according to a modification.

Further, how the common electroconductive line 53 is arranged is not particularly limited, and may be appropriately changed without departing from the gist of the present disclosure. For example, as illustrated in FIG. 7(a), the common electroconductive line 53 may be arranged so as not to be parallel to the virtual line VL1. Further, the other end 53b of the common electroconductive line 53 is not necessarily placed on the end electroconductive line 52. For example, as illustrated in FIG. 7(b), the other end 53b may be placed on the first electroconductive line 50C. In this case, the mesh portion 62A can be widened.

Further, the configuration illustrated in FIG. 4 is merely an example of the configuration of the electroconductive layer 5, and the shapes of the radiating element portion 5A, the power supply portion 5B, and the ground portion 5C may be appropriately changed.

FIG. 1 is merely an example of the overall configuration of the electroconductive film, and the electroconductive layer may be formed in any range and shape in the electroconductive film.

Although the display device has been exemplified as the device to which the electroconductive film is applied, the electroconductive film may be applied to other devices. For example, the electroconductive film may be applied to glass of a building, an automobile, or the like.

EXAMPLE

Among the above-described embodiments, the electroconductive pattern 60A illustrated in FIG. 5 was prepared as an example. An average area ratio of the end mesh portion 65 of the example is indicated in the table of FIG. 9. The average area ratio is a ratio of the average opening area of the end mesh portion 65 for a case where the opening area of the basic mesh portion 61 is set to "1".

As a comparative example, an electroconductive pattern 60A as illustrated in FIG. 8 was prepared. The electroconductive pattern 60A according to the comparative example has a configuration in which the slit portion 6 is formed as it is with respect to the arrangement of the basic mesh portion 61. Therefore, near the end electroconductive line 52, narrow triangular mesh portions 113A and 113B and pentagonal mesh portions 112A and 112B are formed.

In the example and the comparative example, the thickness of the electroconductive line is set to 1 μm, and the pitch of the basic mesh portion 61 is set to 100 μm. In the example illustrated in FIG. 5 and the comparative example illustrated in FIG. 8, the dimension of the electroconductive pattern 60A in the X-axis direction is set to 200 μm.

Figure 10:
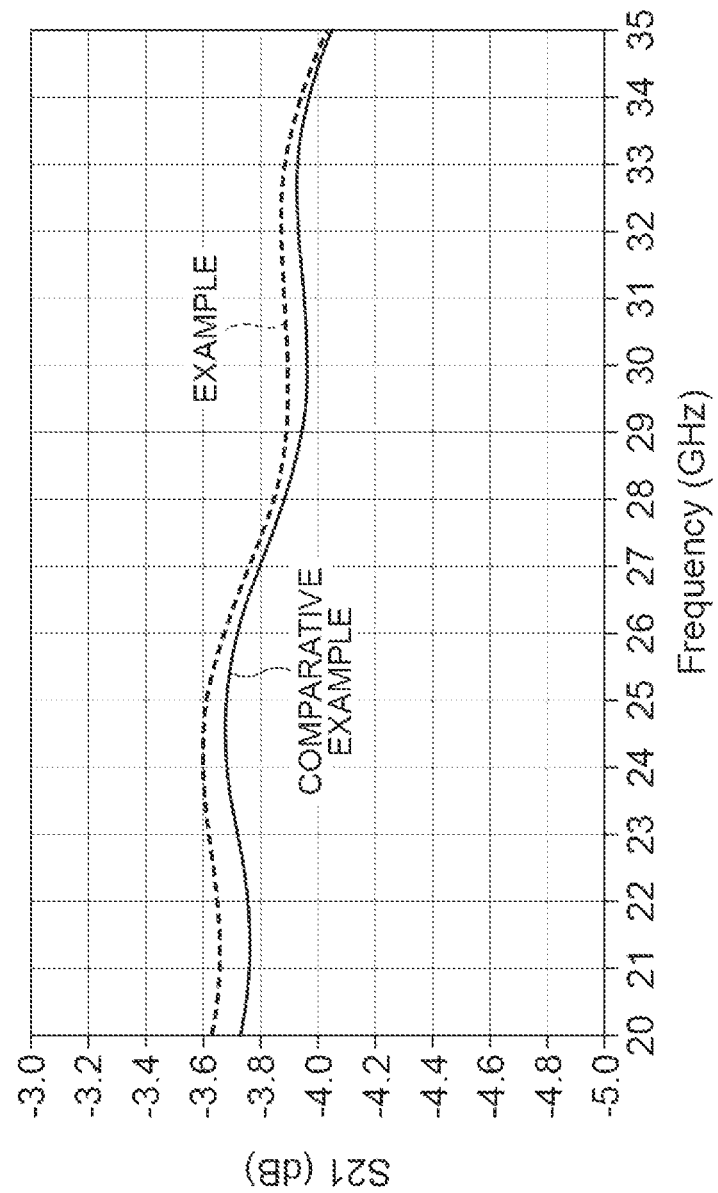
FIG. 10 is a graph illustrating measurement results of an example and a comparative example.

As for the example and comparative example, a transmission loss "S21" was evaluated by electromagnetic field simulation in order to confirm the transmission characteristics. For the simulation, electromagnetic field analysis software HFSS (ANSYS, Inc.) was used. Simulation results of the example and the comparative example are indicated in FIG. 10. In the graph of FIG. 10, the vertical axis represents a value (dB) of the transmission loss "S21", and the horizontal axis represents a frequency. Further, the value of the transmission loss "S21" at 28 GHz is indicated in the table of FIG. 9.

The example has good transmission characteristics because the density of the mesh is higher in the example than in the comparative example. As for the example, it can be said that the transmission characteristics are better as the reduction from the value of the transmission loss "S21" of the comparative example is prevented. As understood from the table in FIG. 9 and the graph in FIG. 10, in the example, the value of the transmission loss "S21" is lower than that in the comparative example, namely, is a value close to 0 (zero), and thus, the degradation of transmission characteristics is prevented.

The technique according to the present disclosure includes the following configuration examples, yet is not limited thereto.

An electroconductive film according to one aspect of the present disclosure is an electroconductive film including: a film-like substrate; and a mesh-like electroconductive pattern disposed on a main surface of the substrate, in which the electroconductive pattern includes a plurality of first electroconductive lines and a plurality of second electroconductive lines configured to extend along the main surface and intersect each other, and to be inclined with respect to an end electroconductive line constituting an end part of the electroconductive pattern, the electroconductive pattern includes at least a first mesh portion including the end electroconductive line; a second mesh portion adjacent to the first mesh portion; and a third mesh portion configured to have a polygonal shape different from that of each of the first mesh portion and the second mesh portion and not to include the end electroconductive line as one side constituting the mesh portion, and in a case where a triangular virtual mesh portion including a portion extended from one electroconductive line of the first electroconductive line and of the second electroconductive line which constitute the third mesh portion to the end electroconductive line, a virtual line assuming that another electroconductive line is extended to the end electroconductive line, and the end electroconductive line is set, a length of a common electroconductive line between the first mesh portion and the third mesh portion is longer than the virtual line of the virtual mesh portion, and each of an opening area of the first mesh portion and an opening area of the second mesh portion is larger than an opening area of the virtual mesh portion.

According to the electroconductive film, the electroconductive pattern includes the plurality of first electroconductive lines and the plurality of second electroconductive lines that extend along the main surface and intersect each other, and are inclined with respect to the end electroconductive lines constituting the end parts of the electroconductive pattern. The electroconductive pattern includes a third mesh portion that does not include the end electroconductive line as one side constituting the mesh portion. In addition, the electroconductive pattern includes the first mesh portion including the end electroconductive line and the second mesh portion adjacent to the first mesh portion. The first mesh portion and the second mesh portion each have a polygonal shape different from that of the third mesh portion. As described above, it is necessary to apply adjustments to the first mesh portion and the third mesh portion arranged at the end parts of the electroconductive pattern in order to prevent the collapse of the electroconductive lines due to an excessively small opening area. Here, the triangular virtual mesh portion includes a portion extended from one electroconductive line of the first electroconductive line and of the second electroconductive line which constitute the third mesh portion to the end electroconductive line, a virtual line assuming that the other electroconductive line is extended to the end electroconductive line, and the end electroconductive line. Such a virtual mesh portion is a region where the opening area is likely to be narrowed because the end electroconductive line and the electroconductive lines are densely packed. On the other hand, the length of the common electroconductive line between the first mesh portion and the second mesh portion is longer than the virtual line of the virtual mesh portion. That is, the common electroconductive line can be arranged at a position where the virtual line is shifted so that the opening area of the first mesh portion is increased. Further, each of the opening area of the first mesh portion and the opening area of the second mesh portion is larger than the opening area of the virtual mesh portion. Accordingly, in the end parts of the electroconductive pattern, it is possible to prevent the visibility from being increased due to collapse of the electroconductive line or the like. In addition, in a case where the opening area is increased by omitting the electroconductive line, the transmission characteristics are degraded due to the reduction in the electroconductive line. However, herein, the opening area is increased by shifting the common electroconductive line from the virtual line. This prevents the reduction in amount of the electroconductive lines and prevents the degradation of transmission characteristics. As described above, it is possible to reduce the visibility of the electroconductive lines at the end parts of the electroconductive pattern while preventing extreme degradation of transmission characteristics.

Further, the one end of the common electroconductive line may be placed on one electroconductive line excluding a vertex in the third mesh portion. This allows the common electroconductive line to be shifted to a position where the opening area of the first mesh portion is larger than that of the virtual mesh portion.

Further, the common electroconductive line and the other electroconductive line may be parallel to each other. In this case, the electroconductive pattern can be easily designed.

Further, the other end of the common electroconductive line may be placed on the end electroconductive line. In this case, it is possible to prevent the opening area of the second mesh portion from becoming too small.

Further, the other end of the common electroconductive line is not necessarily placed on the end electroconductive line. In this case, the first mesh portion can be widened.

Further, the length of the common electroconductive line may be equal to or less than the length of the other electroconductive line of the third mesh portion. In this case, it is possible to mitigate the imbalance in opening area between the first mesh portion and the second mesh portion due to the common electroconductive line being too long.

In addition, the first mesh portions may be arranged in the end parts of the electroconductive pattern so as to be symmetric with each other, and the second mesh portions may be arranged in the end parts of the electroconductive pattern so as to be symmetric with each other. In this case, the electroconductive pattern can be made into a simple shape.

Further, the end electroconductive line may extend along the extending direction of the electroconductive pattern. In this case, the end electroconductive line extends along the direction in which electricity flows through the electroconductive pattern. That is, it is possible to provide the first mesh portion in which the degradation of transmission characteristics as described above is prevented at the both end parts with respect to the flow of electricity.

Further, the first mesh portion and the second mesh portion may be regularly arranged along the extending direction of the end electroconductive line. In this case, the electroconductive pattern can be easily designed in a constant pattern.

Further, the widths of the first electroconductive lines and the second electroconductive lines may be less than 2 μm. In this case, the electroconductive lines can be made sufficiently thin to lower the visibility.

A display device according to one aspect of the present disclosure includes the above-described electroconductive film.

According to the display device, functions and effects similar to those of the above-described electroconductive film can be obtained.

Embodiment 1

An electroconductive film including: a film-like substrate; and a mesh-like electroconductive pattern disposed on a main surface of the substrate, in which
 the electroconductive pattern includes a plurality of first electroconductive lines and a plurality of second electroconductive lines configured to extend along the main surface and intersect each other, and to be inclined with respect to an end electroconductive line constituting an end part of the electroconductive pattern,
 the electroconductive pattern includes at least
 a first mesh portion including the end electroconductive line;
 a second mesh portion adjacent to the first mesh portion; and
 a third mesh portion configured to have a polygonal shape different from that of each of the first mesh portion and the second mesh portion and not to include the end electroconductive line as one side constituting the mesh portion, and
 in a case where a triangular virtual mesh portion including a portion extended from one electroconductive line of the first electroconductive line and of the second electroconductive line which constitute the third mesh portion to the end electroconductive line, a virtual line assuming that another electroconductive line is extended to the end electroconductive line, and the end electroconductive line is set, a length of a common electroconductive line between the first mesh portion and the third mesh portion is longer than the virtual line of the virtual mesh portion, and each of an opening area of the first mesh portion and an opening area of the second mesh portion is larger than an opening area of the virtual mesh portion.

Embodiment 2

The electroconductive film according to embodiment 1, in which one end of the common electroconductive line is placed on the one electroconductive line excluding a vertex in the third mesh portion.

Embodiment 3

The electroconductive film according to embodiment 1 or 2, in which the common electroconductive line and the other electroconductive line are parallel to each other.

Embodiment 4

The electroconductive film according to any one of embodiments 1 to 3, in which another end of the common electroconductive line is placed on the end electroconductive line.

Embodiment 5

The electroconductive film according to any one of embodiments 1 to 3, in which another end of the common electroconductive line is not placed on the end electroconductive line.

Embodiment 6

The electroconductive film according to any one of embodiments 1 to 5, in which a length of the common electroconductive line is equal to or less than a length of the other electroconductive line of the third mesh portion.

Embodiment 7

The electroconductive film according to any one of embodiments 1 to 3, in which
the first mesh portion is arranged in both end parts of the electroconductive pattern so as to be symmetric with each other, and
the second mesh portion is arranged in the both end parts of the electroconductive pattern so as to be symmetric with each other.

Embodiment 8

The electroconductive film according to any one of embodiments 1 to 7, in which the end electroconductive line extends along an extending direction of the electroconductive pattern.

Embodiment 9

The electroconductive film according to any one of embodiments 1 to 8, in which the first mesh portion and the second mesh portion are regularly arranged along an extending direction of the end electroconductive line.

Embodiment 10

The electroconductive film according to any one of embodiments 1 to 9, in which widths of the first electroconductive line and the second electroconductive line are less than 2 μm.

Embodiment 11

A display device including the electroconductive film according to any one of embodiments 1 to 10.

REFERENCE SIGNS LIST

1 Light transmissive substrate (substrate)
1S Main surface of substrate
20 Electroconductive film
50 First electroconductive line
51 Second electroconductive line
52 End electroconductive line
53 Common electroconductive line
60A Electroconductive pattern
61 Basic mesh portion (third mesh portion)
62A, 62B Mesh portion (first mesh portion)
63A, 63B Mesh portion (second mesh portion)
100 Display device
VE1 Virtual mesh portion

The invention claimed is:

1. An electroconductive film comprising: a film-like substrate; and a mesh-like electroconductive pattern disposed on a main surface of the substrate, wherein
the electroconductive pattern includes a plurality of first electroconductive lines and a plurality of second electroconductive lines configured to extend along the main surface and intersect each other, and to be inclined with respect to an end electroconductive line constituting an end part of the electroconductive pattern,
the electroconductive pattern includes at least
a first mesh portion including the end electroconductive line;
a second mesh portion adjacent to the first mesh portion; and
a third mesh portion configured to have a polygonal shape different from that of each of the first mesh portion and the second mesh portion and not to include the end electroconductive line as one side constituting the mesh portion, and
in a case where a triangular virtual mesh portion including a portion extended from one electroconductive line of the first electroconductive line and of the second electroconductive line which constitute the third mesh portion to the end electroconductive line, a virtual line assuming that another electroconductive line is extended to the end electroconductive line, and the end electroconductive line is set,
a length of a common electroconductive line between the first mesh portion and the third mesh portion is longer than the virtual line of the virtual mesh portion, and
each of an opening area of the first mesh portion and an opening area of the second mesh portion is larger than an opening area of the virtual mesh portion.

2. The electroconductive film according to claim 1, wherein one end of the common electroconductive line is placed on the one electroconductive line excluding a vertex in the third mesh portion.

3. The electroconductive film according to claim 1, wherein the common electroconductive line and the another electroconductive line are parallel to each other.

4. The electroconductive film according to claim 1, wherein another end of the common electroconductive line is placed on the end electroconductive line.

5. The electroconductive film according to claim 1, wherein another end of the common electroconductive line is not placed on the end electroconductive line.

6. The electroconductive film according to claim 1, wherein a length of the common electroconductive line is equal to or less than a length of the another electroconductive line of the third mesh portion.

7. The electroconductive film according to claim 1, wherein the first mesh portion is arranged in both end parts of the electroconductive pattern so as to be symmetric with each other, and the second mesh portion is arranged both end parts of the electroconductive pattern so as to be symmetric with each other.

8. The electroconductive film according to claim 1, wherein the end electroconductive line extends along an extending direction of the electroconductive pattern.

9. The electroconductive film according to claim 1, wherein the first mesh portion and the second mesh portion are regularly arranged along an extending direction of the end electroconductive line.

10. The electroconductive film according to claim 1, wherein widths of the first electroconductive line and the second electroconductive line are less than 2 μm.

11. A display device comprising the electroconductive film according to claim 1.

* * * * *